United States Patent [19]
Ichimura et al.

[11] Patent Number: 4,564,580
[45] Date of Patent: Jan. 14, 1986

[54] PHOTOSENSITIVE RESIN COMPOSITION

[75] Inventors: Kunihiro Ichimura, Yatabe; Tsuguo Yamaoka, Funabashi; Sadayoshi Kaneda; Toru Shibuya, both of Tokyo, all of Japan

[73] Assignees: Kogyo Gijutsuin; Murakami Screen Kabushiki Kaisha, both of Tokyo, Japan

[21] Appl. No.: 624,963

[22] Filed: Jun. 26, 1984

[30] Foreign Application Priority Data

Jun. 30, 1983 [JP] Japan ................. 58-118486
Jun. 30, 1983 [JP] Japan ................. 58-118487
Jun. 30, 1983 [JP] Japan ................. 58-118488
May 23, 1984 [JP] Japan ................. 59-104236

[51] Int. Cl.$^4$ ............................................. G03C 1/68
[52] U.S. Cl. ................................. 430/281; 430/270; 430/287; 430/906; 430/909; 430/905
[58] Field of Search ............... 430/270, 281, 287, 906, 430/908, 905

[56] References Cited

U.S. PATENT DOCUMENTS

| | | | |
|---|---|---|---|
| 4,221,859 | 9/1980 | Fanger et al. | 430/906 |
| 4,245,030 | 1/1981 | Faust et al. | 430/905 |
| 4,245,031 | 1/1981 | Chambers | 430/905 |
| 4,273,857 | 6/1981 | Leberzamm et al. | 430/905 |
| 4,339,524 | 6/1982 | Ichimura et al. | 430/270 |
| 4,444,868 | 4/1984 | Ichimura et al. | 430/287 |

Primary Examiner—Jack P. Brammer
Attorney, Agent, or Firm—Wenderoth, Lind & Ponack

[57] ABSTRACT

Disclosed is a photosensitive resin composition comprising an aqueous dispersion or emulsion comprising components (1), (3) and (4) as indispensable components and optionally the following component (2):

(1) a water-soluble saponified vinyl acetate polymer to which a styrylpyridinium or styrylquinolinium group has been added;
(2) a water-dispersible or hydrophobic polymer;
(3) a photo-polymerizable unsaturated compound having an ethylenically unsaturated group; and
(4) a photo-polymerization initiator.

This composition has excellent dispersion stability, sensitivity and resolving power and produces a hardened product having good solvent resistance, water resistance and abrasion resistance.

7 Claims, No Drawings

PHOTOSENSITIVE RESIN COMPOSITION

BACKGROUND OF THE INVENTION

1. Field of the Invention

The present invention relates to an aqueous emulsion or dispersion type photosensitive resin composition which is highly suitable for production of printing plates, especially screen printing plates.

2. Description of the Prior Art

Various photosensitive resin compositions have been used as printing plate materials, photoresists for photo-etching and vehicles for paints and printing inks. Especially, photosensitive resin compositions as materials for printing plates are required to satisfy not only basic requirements such as high sensitivity and high resolving power but also printing resistance sufficient to resist stresses such as friction or compression under application of an oily or aqueous ink, good adhesion to a substrate and good storage stability.

Known photosensitive resin compositions to be applied to the above mentioned uses are roughly divided into the solvent development type, the aqueous alkali development type and the water development type. Most of these known photosensitive resin compositions are homogeneous photosensitive compositions, and aqueous emulsions are used in some of the water development type compositions. For example, a photosensitive resin composition comprising an aqueous emulsion of a polymer such as partially saponified polyvinyl acetate and a photo-crosslinking agent such as a dichromate or a diazo resin is used particularly for a screen printing plate.

However, such conventional aqueous emulsion type photosensitive resin compositions are also accompanied by problems in that (a) the solvent resistance of a basic polymer constituting an aqueous emulsion is insufficient, (b) since the amount of partially saponified polyvinyl acetate should be increased so as to prevent reduction of the solvent resistance of the photosensitive resin composition, the water resistance is reduced and (c) a relatively large amount of a surface active agent is used as an emulsifier for the polymer emulsion. For these reasons, cured or hardened films having excellent water resistance, solvent resistance and printing resistance cannot be prepared from the conventional aqueous emulsion type photosensitive resin compositions.

As a water-soluble, high-sensitivity photosensitive polymer having a photo-crosslinking property, there is known a polymer formed by introducing a styrylpyridinium group into a polymer chain of partially saponified polyvinyl acetate (see Japanese patent application Laid-Open Specification Nos. 23163/80 and 62905/80), and there is also known an aqueous emulsion type photosensitive resin composition formed by adding this photo-crosslinkable polymer, instead of the photo-crosslinking agent such as a dichromate or a diazo resin, to an emulsion of a polymer such as polyvinyl acetate (see Japanese patent application Laid-Open Specification No. 62446/80). A composition of this type has excellent sensitivity and storage stability, but from the results of researches we have conducted, it has been found that since an emulsified polymer is used as the main base polymer, several problems described below arise.

In the case where a hardened product obtained by using a polyvinyl acetate emulsion as a typical polymer emulsion is used for fabrication of a printing plate, this plate has insufficient oil resistance and is readily corroded by an organic solvent contained in an ink. Furthermore, the plate has insufficient water resistance, and corrosion thereof is promoted in a state where water is incorporated in the organic solvent. Moreover, at the step of mixing an emulsion such as an acrylic acid ester resin emulsion, an ethylene-acrylic acid ester copolymer resin emulsion, an SBR latex, a silicone resin emulsion, a vinyl chloride resin emulsion or a vinylidene chloride emulsion with an aqueous solution of saponified polyvinyl acetate to which a styrylpyridinium group has been added, such troubles as increase of the viscosity, gelation, dispersion fracture of the emulsion and formation of coarse particles arise. In the case of each of the foregoing emulsions, since a relatively large amount of a surface active agent is used, the solvent resistance and water resistance of the hardened product obtained are degraded by the presence of the surface active agent.

SUMMARY OF THE INVENTION

It is an object of the present invention to provide a photosensitive resin composition of the aqueous dispersion or aqueous emulsion type in which the above described problems of the conventional techniques are overcome, and which can produce a hardened product having good solvent resistance, water resistance and abrasion resistance and has excellent dispersion stability, sensitivity and resolving power.

More specifically, in accordance with the present invention, there is provided a photosensitive resin composition comprising an aqueous dispersion selected from the group consisting of solutions and emulsions comprising at least the components (1), (3) and (4) of the following components (1) through (4):

(1) a water-soluble saponified vinyl acetate polymer to which a styrylpyridinium group or a styrylquinolinium group has been added;

(2) a polymer selected from the group consisting of water-dispersible polymers and hydrophobic polymers;

(3) a photo-polymerizable unsaturated compound having an ethylenically unsaturated group; and (4) a photo-polymerization initiator.

According to the present invention, by dispersing a water-dispersible or a hydrophobic polymer (2) and a photopolymerizable unsaturated compound (3) into an aqueous solution of a styrylpyridium or styrylquinolinium group-added polymer (1) which has a photo-crosslinking property of a high sensitivity, a stable photosensitive resin composition of the aqueous emulsion or aqueous dispersion type can be obtained without using a surface active agent or with a small amount of a surface active agent if used. When this composition is cured or hardened by photo-crosslinking accelerated by a photo-polymerization initiator (4) added thereto, by virtue of the combination of the above three components, a hardened product which has high water resistance and solvent resistance and excellent film characteristics can be obtained and is hence very suitable for fabrication of screen printing plates and other printing plates.

The reason why the composition of the present invention has excellent properties suitable for attaining the object of the present invention has not been completely elucidated, but it is believed that this excellent effect can be attained as the sum of the following factors. Since the styrylpyridinium or styrylquinolinium group-added vinyl acetate polymer (hereinafter referred to as "water-soluble photo-dimerizable polymer") has an emulsifying action with respect to a photo-polymerizable compound such as a vinyl monomer when this water-soluble photo-dimerizable polymer is used as a matrix and emulsifier and a photo-polymerizable compound containing a photo-polymerization initiator is emulsified, a stable aqueous emulsion can be obtained. Even if the photo-polymerization initiator and photo-polymerizable compound are not easily soluble in water or are insoluble in water, because of the emulsifying capability of the water-soluble photo-dimerizable polymer, the composition can be used as a photosensitive material of the water development type. On the other hand, the water-dispersible polymer per se has water dispersibility. Accordingly, if the above components are mixed, a stable composition of the present invention can be used without using a large quantity of a surface active agent. Accordingly, the composition of the present invention has high sensitivity and high resolving power, which are due to the presence of the water-soluble photo-dimerizable polymer, and excellent film characteristics of the water-dispersible polymer, such as high water resistance and solvent resistance, contribute to formation of a good hardened product. Moreover, the photo-polymerizable compound causes graft copolymerization at the hardening step by using the remaining acetyl group of the water-soluble photo-dimerizable polymer or the like. As a result of these factors, a hardened product of the composition of the present invention has good water resistance and solvent resistance in combination and also has good film characteristics.

It is preferred that the component (2) of the composition of the present invention be a water-dispersible polymer, but it can be a hydrophobic polymer (actually, in the form of an emulsion of a hydrophobic polymer), because the above-mentioned problems of the conventional techniques can be overcome by emulsification of the component (3) by the emulsifying action inherently possessed by the component (1). Similarly, the component (2) is preferable, but is not essential to the present invention.

DETAILED DESCRIPTION OF THE PREFERRED EMBODIMENTS

Photosensitive Resin Composition

The photosensitive resin composition of the present invention contains the above mentioned components (1) through (4) as indispensable components. These components will now be described in detail. In the description given hereinafter, all quantities expressed in "parts" and "%" are by weight unless otherwise indicated.

Photosensitive Saponified Vinyl Acetate Polymer [Component (1)]

The continuous phase of the photosensitive resin composition of the aqueous emulsion or aqueous dispersion type according to the present invention comprises an aqueous solution of the component (1), that is, a styrylpyridinium or styrylquinolinium group-added saponified vinyl acetate polymer (water-soluble photo-dimerizable polymer). This polymer is obtained by subjecting a vinyl acetate polymer to saponification and addition of a styrylpyridinium or styrylquinolinium group, preferably in this order. The term "addition" means a chemical addition.

The polymer chain having a styrylpyridinium or styrylquinolinium group or the polymer chain to which this group is added in the above mentioned preferred order comprises a saponified vinyl acetate polymer. By the term "vinyl acetate polymer" used herein are meant polyvinyl acetate, a copolymer of vinyl acetate with a monomer copolymerizable therewith, a lower ($C_1$-$C_4$) acetal of a saponified polyvinyl acetate, such as formal or butyral of a saponified polyvinyl acetate, and a saponified polyvinyl acetate acetalized with a p-benzaldehyde-sulfonic acid salt, a β-butylaldehydesulfonic acid salt, an o-benzaldehyde-sulfonic acid salt or a 2,4-benzaldehyde-sulfonic acid salt.

In the case where the vinyl acetate polymer is a copolymer, examples of the monomer copolymerizable with vinyl acetate which can be used are ethylene, acrylates such as methyl acrylate and methyl methacrylate, acrylamides such as acrylamide, methacrylamide, N-methylolacrylamide and N,N-dimethylacrylamide, unsaturated carboxylic acids and salts thereof such as acrylic acid, methacrylic acid, crotonic acid, fumaric acid, itaconic acid, maleic acid and salts thereof, and cationic monomers such as dimethylaminoethyl methacrylates, vinylimidazole, vinylpyridine and vinylsuccinimide.

In order to form a composition for which water development is possible and which gives a hardened product of excellent solvent resistance and water resistance after photo-hardening, it is preferred that the saponification degree of the saponified vinyl acetate polymer into which a styrylpyridinium or styrylquinolinium group is to be introduced be in the range of from 70 to 99 mole %. By the term "saponified vinyl acetate polymer having a saponification degree of 70 to 99 mole %", it is meant that if the starting vinyl acetate polymer is a homopolymer of vinyl acetate, the content of the vinyl alcohol units is 70 to 99 mole %. In other words, a vinyl alcohol polymer having a vinyl alcohol content of 70 to 99 mole % is meant. Accordingly, the content of the monomer copolymerizable with vinyl acetate, which constitutes the vinyl acetate polymer, should be restricted so that the above mentioned value of the saponification degree can be given. For the same reason as described above with respect to the limitation of the saponification degree, it is preferred that the polymerization degree of the vinyl acetate polymer be 300 to 3,000.

The styrylpyridinium or styrylquinolinium group-added polymer that is used in the present invention is prepared by adding a styrylpyridinium or styrylquinolinium group to the above mentioned saponified vinyl acetate polymer according to an appropriate method, preferably by acetalization utilizing an alcoholic hydroxyl group contained in the saponified vinyl acetate polymer. The styrylpyridinium or styrylquinolinium group obtained according to this preferred method is typically represented by the following formula:

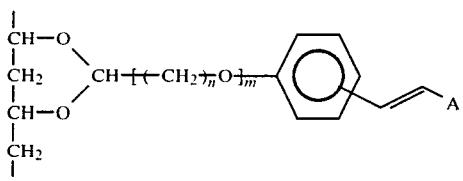

wherein: m is 0 or 1; n is an integer of from 1 to 6; and A stands for

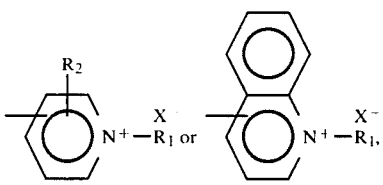

in which $R_1$ stands for a hydrogen atom or an alkyl or aralkyl group which may contain a hydroxyl group, a carbamoyl group, an ether bond or an unsaturated bond, $R_2$ stands for a hydrogen atom or a lower alkyl group, and $X^-$ stands for a halide ion, a phosphate ion, a p-toluene-sulfonate ion, a methyl sulfate ion, an ethyl sulfate ion or a mixture of two or more of these anions. When $R_1$ is an alkyl or aralkyl group, it is preferably of 1 to 8 carbon atoms. When $R_2$ is a lower alkyl, it is preferably of 1 to 4 carbon atoms.

The styrylpyridinium-added polymers as disclosed above and their preparation are known by, for example, Japanese patent application Laid-Open Specification Nos. 23163/1975, 62905/1977 and 62405/1975. The styrylquinolinium-added polymers are prepared by the use as a quinolinium source compound of a quinolinium equivalent to the pyridinium source compound used in these known processes for preparing styrylpyridinium-added polymers.

It is considered that this component (1) is dimerized through the styryl group by light energy. It is preferred that the ratio of introduction of the styrylpyridinium or styrylquinolinium group be 0.3 to 20 mole %, especially 0.5 to 10 mole %, based on the saponified vinyl acetate units. If the introduction ratio is lower than 0.3 mole %, a water-soluble photo-dimerizable polymer having a desirable photo-crosslinking property cannot be obtained. If the introduction ratio exceeds 20 mole %, the water solubility of the product will be drastically reduced. The continuous phase of the emulsion composition of the present invention is composed of an aqueous solution of the above mentioned water-soluble photo-dimerizable polymer (1) (which polymer per se can be isolated by throwing the reaction liquid obtained by the above mentioned acetalization to a large quantity of a poor solvent such as acetone or alcohol). Since the yield of the above mentioned acetalization is as high as about 80%, this reaction liquid can be used after the concentration is appropriately adjusted. Moreover, the reaction liquid may be used after the acid used as the catalyst is removed by an ion exchange resin.

A mixture of two or more of the above mentioned polymers may be used as the component (1).

Water-Dispersible or Hydrophobic Polymer

[Component (2)]

The component (2) of the composition of the present invention is a water-dispersible or hydrophobic polymer which is considered to form the dispersed phase of the dispersion composition of the present invention. By the term "water-dispersible polymer" used herein is meant a polymer which can be formed into an aqueous emulsion by the action of the hydrophilic group bonded to the polymer trunk even without using an emulsifier (or with use of an emulsifier in an amount much smaller than the amount necessary for emulsification of a hydrophobic polymer). The hydrophilic group may be present within the polymer chain of the polymer trunk or may be pendant from the polymer chain. The hydrophilic group may be a cationic, anionic or nonionic group or a combination thereof. Examples of such groups are a quaternary ammonium group, a carboxylate (salt) group, a phosphonium group, a sulfonium group, a sulfonate group, a phosphonate group, and a polyethylene oxide group. Anionic hydrophilic groups, especially carboxylate and sulfonate groups, are preferred.

One specific example of the water-dispersible polymer is a polymer in which the base polymer is a polyurethane resin, especially an aqueous dispersion thereof. Various processes have been proposed for the preparation of aqueous dispersions of polyurethane resins. For example, an aqueous dispersion obtained according to a process in which polyurethane is dispersed in water under a high shearing force in the presence of an emulsifier is disclosed in the specification of U.S. Pat. No. 3,294,724. However, this aqueous dispersion is unsatisfactory in that the dispersion state is insufficient, and the resulting film has low resistance to water. These drawbacks can be moderated by a water-dispersible high-molecular-weight polyurethane resin formed by bonding a small amount of a hydrophilic group to a high-molecular-weight polyurethane resin. A dispersion formed by dispersing this water-dispersible high-molecular-weight polyurethane resin is semi-permanently stable, and a film formed from this dispersion has high elasticity and tensile strength and also has high resistance to hydrolysis.

In the present invention, as one water-dispersible polymer forming the dispersed phase, a high-molecular-weight polyurethane resin rendered water-dispersible by a hydrophilic group bonded thereto in the absence of an emulsifier can be used. The process for the preparation of these polyurethane dispersions is disclosed, for example, in Japanese Patent Publication Nos. 9076/68, 27904/69 and 26312/70, Japanese patent application Laid-Open Specification No. 2794/75 and Japanese Patent Publication No. 27349/65. Moreover, a polyurethane dispersion containing polyethylene oxide ether is disclosed in West German Laid-Open Patent Specification Nos. 2,141,805 and 2,141,807, and a water-dispersible polyurethane having an amino group in the main chain is disclosed in J. Appl. Polym. Sci., 9, 2451 (1965). Another analogous polyurethane dispersion that can be used in the present invention is a polyurethane dispersion modified with a vinyl polymer (Japanese patent application Laid-Open Specification No. 3159/75) and an emulsifier-free aqueous dispersion of polyurethane-amide (Japanese patent application Laid-Open Specification No. 13495/75).

Another specific example of the water-dispersible polymer to be considered to form the dispersed phase of the dispersion of the present invention is a dispersion of polyester resin, for example, sulfonated polyesters as disclosed in the specifications of U.S. Pat. Nos. 4,052,368, 3,779,993, 3,639,352 and 3,853,820.

Still another example of the water-dispersible polymer is an ionomer resin. The ionomer resin is ordinarily obtained by ion-crosslinking a copolymer of an α-olefin and an α,β-unsaturated carboxylic acid with a metal ion, especially $Na^+$, $K^+$ or $Zn^{++}$. The process for preparing ionomer resins is disclosed, for example, in Japanese Patent Publication Nos. 6810/64 and 125768/67 and Japanese patent application Laid-Open Specification Nos. 31556/74 and 121891/74.

In order to obtain the composition of the present invention, it is preferred that the water-dispersible polymer be formed into an aqueous dispersion in advance. It also is preferred that the particle size of the water-dispersible polymer (such as a polyurethane, a polyester or an ionomer) in the dispersion be 0.01 to 5μ.

In the present invention, it is preferable that the water-soluble photo-dimerizable polymer be used in an amount of 0.2 to 10 parts per part of the above mentioned water-dispersible polymer. If the amount of the water-soluble photo-dimerizable polymer is less than 0.2 part, the water-soluble photo-dimerizable polymer does not act as a protecting colloid and hence, the homogeneous dispersibility and water developing property are degraded. If the amount of the water-soluble photo-dimerizable polymer exceeds 10 parts, the effect due to addition of the water-dispersible polymer becomes insufficient.

A plurality of the above-mentioned water-dispersible polymers may be used as the component (2) in the present invention.

In the present invention, it is preferred that a water-dispersible polymer as described above be used as the component (2), but a hydrophobic polymer may be used as the component (2) instead of the water-dispersible polymer.

Examples of the hydrophobic polymer constituting the polymer emulsion of the present invention are polyvinyl acetate, a vinyl acetate-ethylene copolymer, a vinyl acetate-acrylic acid ester copolymer (methyl acrylate and 2-ethylhexyl acrylate can be mentioned as the acrylic acid ester), a styrene-butadiene copolymer, a methyl methacrylate-butadiene copolymer, an acrylonitrile-butadiene copolymer, a chloroprene polymer, an isoprene polymer, polyacrylic acid, polymethacrylic acid, polyvinyl chloride, polyvinylidene chloride, polystyrene, a silicone resin, polyethylene, polyurethane and a fluorine resin.

The composition according to this embodiment of the present invention contains an emulsion of a hydrophobic polymer as mentioned above in an amount, as solids, of 20 to 4,000 parts, preferably 40 to 2,000 parts, per 100 parts of the component (1) polymer. This polymer emulsion is added to impart high water resistance and high resolving power to a hardened product of the composition. If the amount of the polymer emulsion is less than 20 parts per 100 parts of the component (1) polymer, the water resistance and resolving power are insufficient, and if the amount of the polymer emulsion exceeds 4,000 parts per 100 parts of the component (1) polymer, water-washing development of the unhardened portion becomes difficult.

Photo-Polymerizable Unsaturated Compound

[Component (3)]

The component (3) of the composition of the present invention is a photo-polymerizable unsaturated compound. As the photo-polymerizable unsaturated compound to be emulsified and dispersed in an aqueous solution of the styrylpyridinium or styrylquinolinium group-added polymer, a water-insoluble or hardly water-soluble compound having at least one photoactive group selected from acryloyl, methacryloyl, allyl, vinyl ether, acrylamide and methacrylamide groups is preferably used. A compound having at least two photo-active groups is especially preferred because it produces a hardened product having good solvent resistance. The photo-polymerizable unsaturated compound includes not only a photo-polymerizable compound generally called "vinyl monomer" but also a photopolymerizable prepolymer or oligomer having a polymerization degree lower than 10,000.

Examples of the photo-polymerizable unsaturated compound are pentaerythritol triacrylate, pentaerythritol trimethacrylate, pentaerythritol tetraacrylate, pentaerythritol tetramethacrylate, trimethylolpropane triacrylate, trimethylolpropane trimethacrylate, trimethylolethane triacrylate, trimethylolethane trimethacrylate, dibromoneopentyl glycol diacrylate, dibromoneopentyl glycol dimethacrylate, 2,8-dibromopropyl acrylate, 2,8-dibromopropyl methacrylate, triallyl isocyanurate, methoxyethyl vinyl ether, tert-butyl vinyl ether, lauryl acrylate, lauryl methacrylate, methoxyethylene glycol acrylate, methoxyethylene glycol methacrylate, 2-ethylhexyl acrylate, 2-ethylhexyl methacrylate, isodecyl acrylate, isodecyl methacrylate, stearyl acrylate, stearyl methacrylate, benzyl acrylate, benzyl methacrylate, hexyl glycol acrylate, hexyl glycol methacrylate, ethylene glycol diacrylate, ethylene glycol dimethacrylate, dihexaethylene glycol diacrylate, dihexaethylene glycol dimethacrylate, ethylene glycol diglycidyl ether acrylate, ethylene glycol diglycidyl ether methacrylate, 2-ethylhexyl glycidyl ether acrylate, 2-ethylhexyl glycidyl ether methacrylate, phenylglycidyl ether acrylate, phenylglycidyl ether methacrylate, 2-methyloctyl glycidyl ether acrylate, 2-methyloctyl glycidyl ether methacrylate, trimethylolpropane polyglycidyl ether polyacrylate, trimethylolpropane polyglycidyl ether polymethacrylate, terephthaloyl diglycidyl ether acrylate, terephthaloyl diglycidyl ether methacrylate, a reaction product of tolylene diisocyanate with 2-hydroxypropyl acrylate or methacrylate, a reaction product of phenyl isocyanurate with 2-hydroxyethyl acrylate or methacrylate, and an unsaturated polyester containing an ethylenically unsaturated group and having a molecular weight lower than 10,000, such as maleic acid glycol ester.

These photo-polymerizable unsaturated compounds may be used singly or in the form of a mixture of two or more of them preferably in an amount of 0.1 to 15 parts per part of the water-dispersible or hydrophobic polymer (2). When a plurality of the water-dispersible or hydrophobic polymers are used, the total amount, as solids, is regarded as one part. If the amount of the photo-polymerizable unsaturated compound is less than 0.1 part, the water resistance is insufficient, and if the photo-polymerizable unsaturated compound is used in an amount exceeding 15 parts, there is a risk of separation and precipitation of the photo-polymerizable unsaturated compound on a film formed by coating and drying the composition.

Photo-Polymerization Initiator

[Component (4)]

The photosensitive composition of the present invention contains a photo-polymerization initiator [component (4)] in addition to the above described components.

All of the compounds capable of initiating photo-polymerization of the above mentioned photo-polymerizable unsaturated compounds can be used as the photo-polymerization initiator in the present invention. For example, substances capable of forming radicals under irradiation with light, such as benzoin alkyl ethers, Michler's ketones, di-tert-butyl peroxide, tribromoacetophenone, anthraquinone derivatives, e.g., tertbutylanthraquinone, and thioxanthone derivatives, e.g., chlorothioxanthone can be used. These photo-polymerization initiators may be used singly or in the form of a mixture of two or more of them preferably in an amount of 0.001 to 0.15 part per part of the photo-polymerizable unsaturated compound.

Types of Composition

Typical examples of the photosensitive resin composition of the present invention are as follows.

(A) A photosensitive resin composition which is photo-crosslinkable and comprises an aqueous emulsion comprising a styrylpyridinium group-added, partially saponified vinyl acetate polymer having a saponification degree of 70 to 99 mole %, a hydrophobic polymer emulsion, a water-insoluble or hardly water-soluble compound having at least one photo-active, ethylenically unsaturated group and a photo-polymerization initiator. The photo-crosslinkability is preferably provided to the composition by the use as the partially saponified vinylacetate polymer of a styrylpyridinium- or styrylquinolinium-added, partially saponified vinyl acetate polymer.

(B) A photosensitive resin composition which comprises an aqueous emulsion comprising an aqueous solution of a styrylpyridinium group-added, partially saponified vinyl acetate polymer having a saponification degree of 70 to 99 mole %, a water-insoluble or hardly water-soluble compound having at least one photo-active, ethylenically unsaturated group and a photo-polymerization initiator.

(C) A photosensitive resin composition which comprises an aqueous dispersion comprising an aqueous solution of a styrylpyridinium group-added saponified vinyl acetate polymer, an ionomer resin, a photo-polymerizable unsaturated compound having an ethylenically unsaturated group and a photo-polymerization initiator.

(D) A photosensitive resin composition comprising an aqueous dispersion selected from the group consisting of solutions and emulsions comprising at least the components (1), (3) and (4) of the following components (1) through (4):

(1) a water-soluble saponified vinyl acetate polymer to which a styrylpyridinium or a styrylquinolinium group has been added;
(2) a polymer selected from the group consisting of water-dispersible polymers and hydrophobic polymers;
(3) a photo-polymerizable unsaturated compound having an ethylenically unsaturated group; and
(4) a photo-polymerization initiator.

Optional Components

The photosensitive resin composition of the present invention comprises principally the above described components, but additives conventionally used for photosensitive compositions of this type can be optionally incorporated in the photosensitive resin composition of the present invention. For example, an emulsion stabilizer can be added in an amount of up to 0.005 part per part of the water-dispersible polymer, and an organic solvent can be added as a dissolution assistant for the photo-polymerizable unsaturated compound in an amount of up to 0.3 part per part of the photo-polymerizable unsaturated compound. Moreover, a heat polymerization inhibitor, a colorant such as a dye or pigment, a defoaming agent and a plasticizer can be used as optional additives.

The composition of the present invention can further comprise a photo-crosslinking agent. As the photo-crosslinking agent, (a) dichromates such as ammonium dichromate, potassium dichromate and sodium dichromate, and (b) diazo resins such as anion complexes of 1-diazodiphenylamine/p-formaldehyde condensates with sulfuric acid salts, phosphoric acid salts and zinc chloride double salts can be used. As the diazo resin, water-soluble diazo resins formed by condensing diazotization products of diphenylamines such as p-aminodiphenylamine, 4-amino-4'-methyldiphenylamine, 4-amino-4'-ethyldiphenylamine, 4-amino-4'-methoxydiphenylamine, 4-amino-4'-chlorodiphenylamine and 4-amino-4'-nitrodiphenylamine with aldehydes such as p-formaldehyde, acetaldehyde, propionaldehyde and n-butylaldehyde can be used. The photo-crosslinking agent can be used in an amount of up to 20 parts per 100 parts of the styrylpyridinium or styrylquinolinium group-added polymer.

Preparation of Composition

The composition of the present invention is ordinarily prepared from the above described components according to the following process. The water-soluble photo-dimerizable polymer [component (1)] is dissolved in a specific amount of water to form an aqueous solution (the acetalization reaction liquor may be used directly, as pointed out hereinbefore). Separately, an aqueous dispersion of the water-dispersible polymer [component (2)] is prepared. The photo-polymerization initiator [component (4)] is dissolved in the photo-active unsaturated compound [component (3)] alone or a mixture thereof with a small amount of an organic solvent (especially, a water-soluble organic solvent), and an inhibitor for thermal polymerization or other optional additive is added. The so-formed solution, the above mentioned aqueous solution of the water-soluble photo-dimerizable polymer [component (1)] and the above mentioned aqueous dispersion of the water-dispersible polymer [component (2)] are stirred and emulsified by a kneader, a screw type agitator or the like, and optional components such as a colorant and a defoaming agent are added according to need. The photo-crosslinking agent dissolved in a small amount of water is further added, if necessary.

The amount of water in the composition of the present invention is not particularly critical, so long as a stable emulsion or aqueous dispersion is obtained. However, it is ordinarily preferred that water be contained in an amount of 0.25 to 19 parts per part of the sum of the water-dispersible polymer, water-soluble photo-dimerizable polymer and photo-polymerizable unsaturated compound.

Utilization of Composition

The so-obtained photosensitive resin composition of the present invention is applied as coating on a substrate appropriately selected according to use, for example, a metal plate such as an aluminum plate, a screen mesh, a paper sheet, a wood plate, a synthetic resin plate or a semiconductor substrate, in such an amount that the thickness of the coating after drying will be 1 to 300 μm, and the coated substrate is dried and used. The so-formed photosensitive material is imagewise irradiated with actinic rays, for example, ultraviolet rays, at a wavelength of 300 to 400 nm and an irradiation energy quantity of 10 to 5,000 mJ/cm$^2$ in the case of ultraviolet rays, whereby the irradiated portion is hardened. Then, the non-irradiated portion is removed by water spraying or the like. Thus, a relief image or image film is obtained, and the relief image or image film is used as a printing plate, a resist film or the like.

According to one preferred embodiment of utilization of the photosensitive resin composition of the present invention, the photosensitive resin composition is used as a photosensitive material for a screen printing plate. In this embodiment, the composition of the present invention is repeatedly coated and dried on a screen mesh composed of a synthetic resin such as a polyester, nylon or polyethylene, a synthetic resin on which a metal such as nickel is vacuum-deposited or a stainless steel, whereby a screen printing plate having a thickness of 40 to 400 μm is obtained.

A screen printing plate can also be prepared according to a process comprising coating and drying the composition of the present invention on a peelable film of polyethylene, polyvinyl chloride or polyester to obtain a coating having a thickness of 15 to 100 μm and transferring this coating on a screen mesh coated with water or with the photosensitive resin composition of the present invention. This process is called "direct-indirect process", and this process is advantageous over the process in which a photosensitive composition is repeatedly coated on a screen mesh because the operation is simplified and a plate of excellent printing characteristics can be obtained. Since the photosensitive composition of the present invention has good storage stability even in the dry state, the composition of the present invention has good adaptability to the operation of this direct-indirect process.

As pointed out hereinbefore, according to the present invention, by dispersing the water-dispersible polymer and photo-polymerizable unsaturated compound in an aqueous solution of the water-soluble photo-dimerizable polymer which itself has a photo-crosslinking property of a high sensitivity, a stable aqueous emulsion or dispersion type photosensitive resin composition can be obtained without using a surface active agent or with a very small amount of a surface active agent if used. Furthermore, when this composition is photo-hardened, by virtue of the combination of the above three components, a hardened product of excellent water resistance and solvent resistance and also having excellent film characteristics, which is very suitable for a screen printing plate and other printing plates, can be obtained.

EXAMPLES OF PREFERRED EMBODIMENT

The present invention will now be described more fully with respect to the following examples, that by no means are intended to limit the scope of the invention.

Referential Example (Preparation of Diazo Resin)

In 300 g of 10% sulfuric acid was dissolved 18.4 g of p-aminodiphenylamine, and the solution was cooled to 0° to 5° C., and a solution of 13.8 g of sodium sulfite in 20 g of water was gradually added to the first solution with stirring through a dropping funnel. Stirring was continued for 1 hour and 30 minutes to accomplish diazotization. The product was precipitated by addition of a saturated aqueous solution of sodium chloride, and the product was recovered by filtration and sufficiently dried at a temperature lower than 25° C. Then, 7.5 g of the obtained powder was dissolved in 15 g of 95% sulfuric acid, and 1 g of p-formaldehyde was gradually added to the solution, the mixture being stirred at 10° C. for 3 hours. Then, 100 ml of ethanol was gradually added to the mixture while the temperature was maintained below 15° C., and the formed precipitate was recovered by filtration, washed sufficiently with 100 ml of ethanol 4 times and dried to obtain a greenish yellow diazo resin powder.

Example A1 (reference)

In 850 g of water was dissolved 150 g of partially saponified polyvinyl acetate having a polymerization degree of 1,700 and a saponification degree of 88 mole % ("Gosenol GH-17" supplied by Nippon Gosei Kagaku Kogyo K.K., Japan), and 200 g of trimethylolpropane triacrylate containing 15 g of benzoin-isobutyl ether was incorporated and emulsified in the solution with stirring. Then, 500 g of a polyvinyl acetate emulsion ("Movinyl HA-10" supplied by Hoechst Gosei K.K., Japan; solid content=50%) was added to the emulsion, and 150 g of a 10% aqueous solution of the diazo resin prepared in the Referential Example was added to the mixture to form a photosensitive liquor. The liquor was applied as coating on a 225-mesh polyester monofilament screen stretched on an aluminum frame by using a bucket. Coating and drying with warm air at 30° to 40° C. were repeated 3 to 4 times to obtain a photosensitive film having a thickness of 90 μm (inclusive of the thickness of the screen).

A positive film for print wiring, which had a fine line of 80 μm, was vacuum-stuck on the photosensitive film of the photosensitive screen plate, and the plate was exposed to rays from a 4-KW super-high pressure mercury lamp (supplied by Oak Seisakusho K.K., Japan) placed 1 m apart from the plate for 2 minutes. Wash-out development of the image was carried out according to the following procedure. The plate was dipped in water maintained at 15° C. for 3 minutes to dissolve out the majority of the unexposed portion, and water maintained at 20° C. was sprayed under a water pressure of 6 Kg/cm$^2$ against the plate from a spray gun located 30 cm apart from the plate to completely remove the remaining photosensitive film from the image area.

Then, the developed plate was dried with warm air maintained at 45° C. for 15 minutes to obtain a plate for a printing plate. This plate had excellent water resistance and solvent resistance, and the swelling degree thereof after 24 hours of dipping in water or an organic solvent was lower by 20 to 50% than that of a conventional diazo type plate.

When 5,000 sheets of a glass-epoxy-copper laminate were printed with an etching resist ink ("SER-400CMAN" supplied by Sanei Kagaku K.K.) by using the so-obtained plate, the image was not blurred and printing could be performed with no change of the printing reproducibility.

Example A2 (reference)

In 850 g of water was dissolved 150 g of partially saponified polyvinyl acetate having a polymerization degree of 1,700 and a saponification degree of 88 mole % ("Gosenol GH-17" supplied by Nippon Gosei Kagaku Kogyo K.K.), and 150 g of pentaerythritol containing 7.5 g of benzoin ethyl ether dissolved therein was incorporated and emulsified in the solution with stirring. Then, 500 g of an ethylene-vinyl acetate copolymer emulsion ("EP-11" supplied by Dainippon Ink Kagaku Kogyo K.K., Japan; solid content=50%) was added to the emulsion, and 150 g of a 10% aqueous solution of the diazo resin prepared in the Referential Example was added to the mixture to obtain a photosensitive liquor. A screen print for printed-wiring boards having a fine line of 80 $\mu$m was prepared by using the so-obtained photosensitive liquor in the same manner as described in Example A1.

When 5,000 glass-epoxy-copper laminates were printed with an etching resist ink ("SER-400 CMAN" supplied by Sanei Kagaku K.K.) by using the so-prepared plate, the image was not blurred.

Example A3 (reference)

In 850 g of water was dissolved 150 g of partially saponified polyvinyl acetate having a polymerization degree of 1,700 and a saponification degree of 78 mole % ("Gosenol KH-17" supplied by Nippon Gosei Kagaku Kogyo K.K.), and a solution of 15 g of benzyldimethyl ketal ("Irgacure 651" supplied by Ciba-Geigy) in 300 g of an acrylate oligomer ("Alonix M-8030" supplied by Toa Gosei K.K., Japan) was incorporated and emulsified in the solution with stirring. Then, 600 g of a polyvinyl acetate emulsion ("Movinyl HA-10" supplied by Hoechst Gosei K.K.; solid content=50%) was added to the emulsion, and 190 g of a 10% aqueous solution of the diazo resin prepared in the Referential Example was added to the mixture to form a photosensitive liquor. An image having a thickness of 70 $\mu$m (inclusive of the screen thickness) was formed on a 300-mesh (polyester Tetoron) monofilament screen stretched on an aluminum frame by using the so-prepared photosensitive liquor in the same manner as described in Example A1, and a cylindrical vinyl chloride resin vessel was printed with a vinyl ink (supplied by Juzyo Kako K.K., Japan) by using the so-prepared plate to reproduce a 70-$\mu$m image. When printing was conducted 10,000 times, it was found that the plate was not changed at all.

Example A4

A solution of 7.5 g of benzoin ethyl ether in 150 g of trimethylolethane triacrylate was added with stirring to 1,000 g of a 10% aqueous solution of a styrylpyridinium group-added polymer formed by adding 1.3 mole % of N-methyl-$\gamma$-(p-formylstyryl)pyridinium-p-toluene-sulfonate to partially saponified polyvinyl acetate having a polymerization degree of 1,700 and a saponification degree of 88 mole % ("Gosenol GH-17" supplied by Nippon Gosei Kagaku Kogyo K.K.) by acetalization, and 300 g of a polyvinyl acetate emulsion ("Movinyl HA-10" supplied by Hoechst Gosei K.K.; solid content=50%) was added to the obtained emulsion. Then, the liquid was colored with 0.3 g of a water-soluble dye (Crystal Violet) to form a photosensitive liquor. A screen plate was prepared by using the so-obtained photosensitive liquor in the same manner as described in Example A1 except that the exposure time was changed to 60 seconds, and printing was carried out by using this plate. This screen plate was capable of resolving a fine line of 80 $\mu$m, and when printing was carried out 5,000 times, no change was found in the plate. It was confirmed that the plate had excellent resistance to the printing operation and had excellent resolving power.

Example A5

A mixed solution of 10 g of benzoin isobutyl ether in 100 g of trimethylolethane triacrylate and 100 g of an acrylate oligomer ("Alonix M-8060" supplied by Toa Gosei Kagaku K.K.) was incorporated and emulsified with stirring into 1,000 g of a 10% aqueous solution of a styrylpyridinium group-added polymer obtained by adding 13% of 1-methyl-4-[p-(2,2-dimethoxyethoxy)-styryl]pyridinium-p-toluenesulfonate to a partially saponified vinyl acetate-sodium unsaturated carboxylate copolymer having a polymerization degree of 1,800 and a saponification degree of 88 mole % ("Poval KL 318" supplied by Kuraray K.K.). Then, 300 g of an ethylenevinyl acetate copolymer emulsion ("EP-11" supplied by Dainippon Ink Kagaku Kogyo K.K.; solid content=50%) was added to the emulsion, and the liquid mixture was colored with 0.3 g of a water-soluble dye (Crystal Violet) to prepare a photosensitive liquor. Formation of a printing plate and printing were carried out as described in Example A1 except that the exposure time was changed to 120 seconds. It was found that the plate was capable of resolving a fine line of 80 $\mu$m, and no change in the plate was caused when printing was carried out 5,000 times.

Example A6

A printing plate was prepared according to the conventional direct-indirect method using the photosensitive liquor formed in Example A4. More specifically, the photosensitive solution was applied as coating on a polyester film having a thickness of 75 $\mu$m by using a wire bar coater, and the coated film was dried with warm air (40° C.) to form a photosensitive film having a thickness of 20 $\mu$m. The film was cut into a required size and was placed on a smooth plate so that the coating surface was located above. A screen (225-mesh polyester monofilament screen) stretched over an aluminum frame was placed on the photosensitive film, and a specific amount of the same photosensitive solution as applied on the polyester film was applied on the screen and stuck by a rubber squeegee while the film was pressed against the screen.

The plate was dried with warm air maintained at 40° C. The polyester film was peeled off to obtain a photosensitive film having a thickness of 85 $\mu$m (inclusive of the screen thickness). Formation of a printing plate and printing were carried out by using this plate in the same manner as described in Example A1. When the exposure time was 50 seconds, the plate was capable of resolving a fine line of 70 $\mu$m. When printing was carried out 5,000 times, no change in the plate was found.

Example A7

A screen plate was prepared according to the conventional indirect method using the photosensitive liquor formed in Example A4. More specifically, the photosensitive liquor was applied as coating on a polyester film having a thickness of 75 μm by a wire bar coater and the coating film was dried with warm air (40° C.) to obtain a photosensitive film having a thickness of 25 μm. A positive film was stuck to the polyester film side of the coated film and was exposed to light from a super-high pressure mercury lamp of 4 KW positioned 1 m apart from the film for 20 seconds. Ample development was conducted with water at 25° C., and the image wetted with water was pressed against a 225-mesh polyester monofilament screen stretched over an aluminum frame and was dried with air at 40° C. The polyester film was peeled off and a photosensitive film having a thickness of 15 μm was obtained on the screen. Then, exposure to light was carried out, and a screen plate having an image capable of resolving a fine line of 70 μm and a smooth image surface was obtained. When printing was conducted 1,000 times in the same manner as described in Example A1, the image was not changed at all.

Example B1

Into 200 g of a 10% aqueous solution of a styrylpyridinium group-added polymer obtained by adding 1.3 mole % of N-methyl-γ-(p-formylstyryl)pyridinium-p-toluene-sulfonate to partially saponified polyvinyl acetate having a polymerization degree of 1,700 and a saponification degree of 88 mole % ("Gosenol GH-17" supplied by Nippon Gosei Kagaku Kogyo K.K.) by acetalization were incorporated and emulsified with stirring 4 g of benzoin isobutyl ether, 23 g of pentaerythritol acrylate containing p-methoxyphenol, 5 g of an acrylate oligomer ("M-600A-U" supplied by Kyoei Yushi Kagaku Kogyo K.K., Japan) and 10 g of an acrylate oligomer ("Alonix M-8030" supplied by Toa Gosei K.K.). Then, 0.1 g of a water-dispersible pigment (New Lactimine Color Green supplied by Dainichi Seiko K.K.) was added to the emulsion to form a photosensitive liquor. The photosensitive liquor was applied as coating on a 225-mesh polyester screen (colored yellow) by using a bucket and dried with warm air at 30° to 40° C. The coating and drying steps were repeated 4 times to obtain a photosensitive film having a thickness of 90 μm (inclusive of the screen thickness). A positive film for printed wiring was stuck to the photosensitive film of the so-obtained photosensitive screen plate, and exposure to light was carried out for 2 minutes and 30 seconds with a 4-KW super-high pressure mercury lamp ("Jet Light" supplied by Oak Seisakusho K.K.) positioned 1 m apart from the plate.

Wash-out development of the image was carried out according to the following procedure. The exposed screen plate was dipped in water at 25° C. for 3 minutes to dissolve out most of the unexposed portion, and water at 20° C. was sprayed under a water pressure of 6 Kg/cm$^2$ by a spray gun disposed 30 cm apart from the screen plate to completely remove the remaining photosensitive film of the image portion. The developed photosensitive plate was dried with warm air at 45° C. for 15 minutes to obtain a screen plate having a fine line of 70 μm for printed-wiring boards. When 5,000 glass-epoxy-copper laminates were printed with an etching ink ("SER-400 CMAN" supplied by Sanei Kagaku) by using the thus prepared plate, the image was not blurred at all.

Example B2

In 200 g of a 10% aqueous solution of a styrylpyridinium group-added polymer obtained by adding 0.7 mole % of N-methyl-α-(p-formylstyryl)pyridinium-p-toluene-sulfonate to partially saponified polyvinyl acetate having a polymerization degree of 1,700 and a saponification degree of 78 mole % ("Gosenol KH-17" supplied by Nippon Gosei Kagaku Kogyo K.K.) by acetalization were incorporated and emulsified with stirring 1.5 g of benzyldimethyl ketal ("Irgacure 651" supplied by Ciba Geigy) and 30 g of an acrylate oligomer ("Alonix M-8030" supplied by Toa Gosei K.K.) containing 0.01 g of p-methoxyphenol dissolved therein. The emulsion was colored with 0.3 g of a water-soluble dye (Kayanol Milling Green GW supplied by Nippon Kayaku K.K.), and a solution of 2 g of a diazo resin (paradiazodiphenylamine-paraformaldehyde condensate) in 18 g of water was added to the emulsion to obtain a photosensitive liquor.

A screen plate was prepared by using this photosensitive liquor in the same manner as described in Example B1. The exposure time was 3 minutes and a fine line of 70 82 m was resolved. When 5,000 glass-epoxy-copper laminates were printed with an etching ink ("SER-400 CMAN" supplied by Sanei Kagaku K.K.) by using this plate, no blurring whatsoever of the image was observed.

Example B3

In 200 g of a 10% aqueous solution of a styrylpyridinium group-added polymer obtained by adding 1.3 mole % of 1-methyl-4-[p-(2,2-dimethoxyethoxy)-styryl]pyridinium-p-toluene-sulfonate to a partially saponified vinyl acetate-sodium unsaturated carboxylate copolymer having a polymerization degree of 1,800 and a saponification degree of 88 mole % ("Kuraray Poval KL" supplied by Kuraray K.K.) were incorporated and emulsified with stirring 8 g of benzoin ethyl ether, 30 g of trimethylolethane triacrylate containing 0.04 g of p-methoxyphenol and 30 g of diethylene glycol diacrylate. Then, 0.1 g of a water-dispersible pigment (New Lactimine Color Green supplied by Dainichi Seika K.K.) was added to the emulsion to prepare a photosensitive solution.

The photosensitive solution was applied as coating on a 350-mesh polyester screen in the same manner as described in Example B1 to prepare a screen plate having a dot image at a density of 100 lines per inch. When printing with a vinyl ink (supplied by Juzyo Kako K.K.) was conducted 30,000 times by using this screen plate, the image was not blurred at all.

Example C1

A homogeneous photo-polymerizable unsaturated compound solution was prepared by dissolving 4 parts of benzoin ethyl ether (an initiator) and 0.01 part of p-methoxyphenol (a thermal polymerization inhibitor) in 30 parts of trimethylolmethane triacrylate ("A-TMM-3" supplied by Shin-Nakamura Kagaku Kogyo K.K., Japan), 15 parts of an acrylate oligomer ("M-8060" supplied by Toa Gosei K.K.) and 5 parts of a polyester type acrylate ("A-BPE-4" supplied by Shin-Nakamura Kagaku Kogyo K.K.). Separately, 260 parts of a 10% aqueous solution of a styrylpyridinium group-added polymer obtained by adding 0.7 mole % of N- methyl-γ-(p-formylstyryl)pyridinium-p-toluene-sulfonate to partially saponified polyvinyl acetate having a polymerization degree of 1,700 and a saponification degree of 88 mole % ("Gosenol GH-17" supplied by Nihon Gosei Kagaku Kogyo K.K.) by acetalization was mixed with 25 parts of a 27% aqueous dispersion of an ionomer resin ("Chemipearl S-100" supplied by Mitsui Sekiyu Kagaku Kogyo K.K.). The photopolymerizable unsaturated compound solution was added to the resulting mixture, and the mixture was stirred for 60 minutes with a stirring motor to obtain a photosensitive liquor in the form of a light yellow emulsion.

The photosensitive liquor was repeatedly applied as coating and dried on a 200-mesh polyester screen (colored in yellow) by using a bucket to form a photosensitive film having a thickness of 10 μm.

The photosensitive film was exposed for 2 minutes to rays from a 4-KW super-high pressure mercury lamp (supplied by Oak Seisakusho K.K.) disposed 1 m apart from the photosensitive film.

The exposed photosensitive film was dipped in water for 2 minutes and subjected to water-spray development to obtain a screen plate capable of resolving a line of about 100 μm. The screen plate was dipped in an aqueous solution of bromophenol and dried to obtain a blue-dyed screen plate.

When the screen plate was immersed in acetone for 24 hours, peeling of the film was not caused, and it was confirmed that the screen plate had excellent solvent resistance.

Example C2

A homogeneous photo-polymerizable unsaturated compound solution was prepared by dissolving 15 parts of benzyldimethyl ketal ("Irgacure 651" supplied by Ciba-Geigy) and 0.005 part of p-methoxyphenol (a thermal polymerization inhibitor) in 27 parts of pentaerythritol triacrylate. Separately, 260 parts of a 15% aqueous solution of a styrylpyridinium group-added polymer obtained by adding 1.3 mole % of N-methyl-γ-(p-formylstyryl)pyridinium-p-toluene-sulfonate to carboxyl-modified, partially saponified polyvinyl acetate having a polymerization degree of 600 and a saponificiation degree of 76 mole % ("KL-506" supplied by Kuraray K.K., Japan) by acetalization was mixed with 42 parts of a 40% aqueous dispersion of an ionomer resin ("Copolene Latex L-6000" supplied by Asahi-Dow K.K.). The photopolymerizable unsaturated compound solution was added to the resulting mixture, and the mixture was stirred for 60 minutes by a stirring motor to obtain a photosensitive liquor in the form of a light yellow emulsion.

The photosensitive liquor was repeatedly applied as coating and dried on a 300-mesh polyester screen (colored red) by using a bucket to form a photosensitive film having a thickness of 15 μm. The photosensitive film was exposed for 2 minutes to rays of a 4-KW super-high pressure mercury lamp (supplied by Oak Seisakusho K.K.) disposed 1 m apart from the photosensitive film. The exposed photosensitive film was dipped in water for 2 minutes and subjected to water spray development to obtain a screen plate capable of resolving a line of about 80 μm. The screen plate was immersed in an aqueous solution of bromophenol and dried to obtain a blue-dyed screen plate.

Comparative Example C1

A photosensitive liquor was prepared as described in Example C2 except that the photo-polymerizable unsaturated compound was not used. The photosensitive liquor was repeatedly applied as coating and dried on a 300-mesh polyester screen (colored red) by using a bucket to obtain a photosensitive film having a thickness of 15 μm. The photosensitive film was exposed for 3 minutes to rays of 4-KW super-high pressure mercury lamp positioned 1 m apart from the photosensitive film, and the exposed photosensitive film was subjected to water spray development.

Comparative Example C2

A photosensitive liquor was prepared as described in Example C2 except that the ionomer resin was not used. The photosensitive liquor was repeatedly applied as coating and dried on a 300-mesh polyester screen (colored red) by using a bucket to form a photosensitive film having a thickness of 15 μm. The photosensitive film was exposed to rays from a 4-KW super-high pressure mercury lamp disposed 1 m apart from the photosensitive film for 3 minutes, and the exposed photosensitive film was subjected to water spray development.

The screen plates obtained in Example C2 and Comparative Examples C1 and C2 were evaluated. The results are shown in Table 1.

TABLE 1

| | Example C2 | Comparative Example C1 | Comparative Example C2 |
|---|---|---|---|
| Exposure time | 2 minutes | 3 minutes | 3 minutes |
| Swelling due to water | 30% | 80% | 65% |
| Abrasion resistance | excellent | poor | poor |
| Appearance of obtained plate | lustrous and beautiful | no luster | lustrous |

Example C3

A homogeneous photo-polymerizable compound solution was prepared by dissolving 7 parts of benzoin isobutyl ether (an initiator) and 0.01 part of p-methoxyphenol (a thermal polymerization inhibitor) in 60 parts of an acrylate oligomer ("M-8030" supplied by Toa Gosei K.K.) and 20 parts of an acrylate oligomer ("M-600A-U" supplied by Kyoei Yushi Kagaku Kogyo K.K.).

Separately, 230 parts of a 10% aqueous solution of a styrylpyridinium group-added polymer obtained by adding 1 mole % of N-methyl-4-[p-(2,2-dimethoxyethoxy)styryl]pyridinium-methosulfate to partially saponified polyvinyl acetate having a polymerization degree of 1,700 and a saponification degree of 78 mole % ("Gosenol KH-17" supplied by Nihon Gosei Kagaku Kogyo K.K.) by acetal exchange reaction was mixed with 25 parts of a 27% aqueous dispersion of an ionomer resin ("Chemipearl S-120" supplied by Mitsui Sekiyu Kagaku Kogyo K.K., Japan). The photo-polymerizable compound solution was added to the resulting mixture, and the mixture was stirred for 60 minutes with a stirrer to obtain a photosensitive liquor in the form of a dense yellow emulsion. The photosensitive liquor was mixed with 0.1 part of a water-dispersible pigment (New Lactimine Color Green supplied by Dainichi Seika K.K.) to obtain a colored photosensitive liquor.

The photosensitive liquor was repeatedly applied as coating and dried on a 250-mesh polyester screen (yellow color) by using a bucket to form a photosensitive film having a thickness of 10 μm.

The photosensitive film was exposed to rays from a 4-KW high-pressure mercury lamp (supplied by Oak Seisakusho K.K.) disposed 1 m apart from the photosensitive film for 2 minutes and 30 seconds. The exposed photosensitive film was immersed in water for 2 minutes and subjected to water spray development to obtain a screen plate with a power of resolving a line of about 100 μm.

Example C4

A homogeneous photo-polymerizable compound solution was obtained by dissolving 8 parts of benzyldimethyl ketal (Irgacure 651) and 0.01 part of p-methoxyphenol (a thermal polymerization inhibitor) in 90 parts of an acrylate oligomer (M-8060 supplied by Toa Gosei K.K.).

Separately, 200 parts of a 10% aqueous solution of a styrylpyridinium group-added polymer obtained by adding 1 mole % of N-methyl-4-[p-(2,2-dimethoxybutoxy)styryl]pyridinium-p-toluene-sulfonate to partially saponified polyvinyl acetate having a polymerization degree of 1,700 and a saponification degree of 88 mole % ("Gosenol GH-17" supplied by Nippon Gosei Kagaku Kogyo K.K.) by acetal exchange reaction was mixed with a 40% aqueous dispersion of an ionomer resin ("Copolene Latex L-4000" supplied by Asahi-Dow K.K.). The photopolymerizable unsaturated compound solution was added to the resulting mixture, and the mixture was stirred for 60 minutes with a stirrer to obtain a photosensitive liquor in the form of a yellow emulsion.

The photosensitive liquor was repeatedly applied as coating and dried on a 250-mesh polyester screen (colored yellow) by using a bucket to form a photosensitive film having a thickness of 10 μm.

The photosensitive film was exposed to rays from a 4-KW super-high pressure mercury lamp placed 1 m apart from the photosensitive film for 3 minutes. The exposed photosensitive film was dipped in water for 2 seconds and subjected to water spray development to obtain a screen plate with a power of resolving a line of about 100 μm.

Example C5

The photosensitive liquor obtained in Example C1 was applied as coating on a polyester film having a thickness of 75 μm by using an experimental bar coater (Type No.9 supplied by Yoshimitsu Kagaku Kiki K.K., Japan) and dried with warm air (40° C.). The thickness of the photosensitive film after drying was 23 μm. The film was placed below a 270-mesh polyester screen (colored yellow) so that the photosensitive film was positioned above, and the screen was fixed to a frame. Then, 10 g of the photosensitive solution obtained in Example C1 was dropped on the screen and the entire surface of the screen was wetted with the photosensitive solution by a squeegee. Then, the screen was dried for 30 minutes with warm air (40° C.), whereby the photosensitive layer was secured to the screen. When the polyester film was slowly peeled by hand, the photosensitive layer was transferred onto the screen. The photosensitive layer had a smooth and lustrous surface. The thus obtained photosensitive film was exposed to rays from a 4-KW super-high pressure mercury lamp (supplied by Oak Seisakusho K.K.) disposed 1 m apart from the photosensitive film for 2 minutes. The exposed photosensitive film was dipped in water for 2 minutes and subjected to water spray development to obtain a screen plate capable of resolving a line of 100 μm with a beautiful edge.

Examples D1 through D6

Components Used

A 15% aqueous solution (hereinafter referred to as "liquid A-1") of a polymer obtained by adding 1.3 mole % of N-methyl-γ-(p-formylstyryl)pyridinium-p-toluenesulfonate to saponified polyvinyl acetate having a polymerization degree of 600 and a saponification degree of 76 mole % (KL-506 supplied by Kuraray K.K.) by acetalization was prepared as the styrylpyridinium group-added, saponified vinyl acetate polymer.

A liquid mixture (hereinafter referred to as "liquid B-1") comprising 3 parts of benzylmethyl ketal (Irgacure 651 supplied by Ciba-Geigy), 0.01 part of p-methoxyphenol (a thermal polymerization inhibitor), 30 parts of tetramethylolmethane triacrylate (a photopolymerizable unsaturated compound, A-TMM-3 supplied by Shin-Nakamura Kagaku Kogyo K.K.), 15 parts of an acrylate oligomer (M-8060 supplied by Toa Gosei K.K.) and 5 parts of a polyester type acrylate [2,2-bis(4-acryloxydiethoxyphenyl)propane] (a photopolymerizable unsaturated compound, A-BPE-4 supplied by Shin-Nakamura Kagaku Kogyo K.K.) was prepared as the photopolymerizable component.

A commercially available polyurethane emulsion ("Desmocor KA-8100" or "Desmocor KA-8066" supplied by Sumitomo-Bayer Urethane K.K.), a commercially available polyurethane emulsion ("Hydran HW-100", "Hydran HW-140" or "Hydran HW-111" supplied by Dainippon Ink Kagaku Kogyo K.K.) or a commercially available polyester emulsion ("Finetex ES-675" supplied by Dainippon Ink Kagaku Kogyo K.K.) was used as the water-dispersible polymer at the weight ratios shown in Table 2.

Experimental Method

When the components were mixed at the weight ratio of Example D1, a suspension having a high viscosity was obtained. The viscosity was adjusted to 2,500 to 5,000 cps at 20° C. by addition of methyl cellosolve or methanol. The photosensitive liquor was filtered through a 300-mesh polyester net, and the photosensitive liquor was repeatedly applied as coating and dried on a 300-mesh polyester net fixed to an aluminum frame by using a bucket to form a photosensitive film having a thickness of 15 μm. A positive film was stuck closely to the photosensitive film and the assembly was exposed to rays from a 4-KW super-high pressure mercury lamp placed 1 m apart from the photosensitive film for 2 minutes. The exposed photosensitive film was dipped in water for 2 minutes and subjected to water spray development to obtain a screen plate capable of resolving a line of about 100 μm. The above steps were repeated in the same manner by using the compositions of Examples D2 through D6. In each case, a screen plate capable of resolving a line of 100 μm was obtained.

Comparative Example D

A photosensitive liquor was prepared by incorporating 62.4 parts of a vinyl acetate polymer emulsion into 260 parts of a 12% aqueous solution of a styrylpyridinium group-added, partially saponified vinyl acetate polymer obtained by adding 1.0 mole % of N-methyl-γ-(p-formylstyryl)pyridinium-p-toluene-sulfonate to saponified polyvinyl acetate having a polymerization degree of 1,700 and a saponification degree of 88 mole % (GH-17 supplied by Nihon Gosei Kagaku Kogyo K.K.) by acetalization. In the same manner as in Examples D1 through D6, the photosensitive liquor was coated on a 300-mesh polyester screen fixed to an aluminum frame to form a photosensitive film having a thickness of 15 μm. A positive film was stuck to the photosensitive film; exposure to light was carried out for 3 minutes; and water development was conducted to obtain a screen plate capable of resolving a line of about 150 μm.

When the plates obtained in Examples D1 through D6 and Comparative Example D were wiped with wastes wetted with acetone, the photosensitive film did not become sticky and the image was not disfigured in the case of the plates of Examples D1 through D6, but the photosensitive film became sticky and some of the dots were caused to disappear in the case of the plate of Comparative Example D.

water-dispersible polymer was mixed with these components as shown in Table 3.

The experiments were carried out in the same manner as in Examples D1 through D6. The compositions and the results of evaluation of the properties are shown in Table 3.

TABLE 3

|  | Example D7 | Example D8 | Example D9 | Example D10 | Example D11 | Example D12 | Comparative Example D |
|---|---|---|---|---|---|---|---|
| Liquid A-1 | 260 parts | 260 parts | 260 parts | 260 parts | 260 parts | 260 parts | — |
| Liquid B-1 | 42 parts | 42 parts | 42 parts | 42 parts | 42 parts | 42 parts | — |
| KA-8100 | 16.8 parts | — | — | — | — | — | — |
| KA-8066 | 20 parts | — | — | — | — | — | — |
| HW-140 | — | 33.6 parts | 33.6 parts | — | 10 parts | — | — |
| HW-100 | — | — | — | 10 parts | 10 parts | 10 parts | — |
| HW-111 | — | 18.6 parts | — | 18.6 parts | 15 parts | — | — |
| ES-675 | — | — | 17 parts | 17 parts | 15 parts | 25 parts | — |
| Resolving Power | 100 μm | 100 μm | 100 μm | 100 μm | 100 μm | 100 μm | 150 μm |
| Water Resistant Strength | excellent | excellent | excellent | excellent | excellent | excellent | good |
| Exposure Time | 2 min. | 2 min. | 2 min. | 2 min. | 2 min. | 2 min. | 3 min. |
| Abrasion Resistance | excellent | excellent | excellent | excellent | excellent | excellent | poor |
| Solvent Resistance | good | good | good | good | good | good | poor |

Each of the photosensitive liquors obtained in Examples D1 through D12 was a homogeneous dispersion, and no trouble occurred during one year of storage.

Examples D13 through D18

A 15% aqueous solution (hereinafter referred to as "liquid A-2") of a polymer obtained by adding 1.3 mole % of N-methyl-γ-(p-formylstyryl)pyridinium-p-toluene-sulfonate and 1 mole % of sodium o-benzaldehyde-sulfonate to partially saponified polyvinyl acetate having a polymerization degree of 500 and a saponification degree of 88 mole % (GL-05 supplied by Nihon Gosei Kagaku Kogyo K.K.) by acetalization was prepared and used as the styrylpyridinium group-added, partially saponified vinyl acetate polymer.

The liquid B-1 was used as the photo-polymerizable component, and as the water-dispersible polymer, not

TABLE 2

|  | Example D1 | Example D2 | Example D3 | Example D4 | Example D5 | Example D6 | Comparative Example D |
|---|---|---|---|---|---|---|---|
| Liquid A-1 | 260 parts | 260 parts | 260 parts | 260 parts | 260 parts | 260 parts | — |
| Liquid B-1 | 42 parts | 42 parts | 42 parts | 42 parts | 42 parts | 42 parts | — |
| KA-8100 | 33.6 parts | — | — | — | — | — | — |
| KA-8066 | — | 41 parts | — | — | — | — | — |
| HW-140 | — | — | 67.2 parts | — | — | — | — |
| HW-100 | — | — | — | 67.2 parts | — | — | — |
| HW-111 | — | — | — | — | 37.3 parts | — | — |
| ES-675 | — | — | — | — | — | 34 parts | — |
| Resolving Power | 100 μm | 100 μm | 100 μm | 100 μm | 100 μm | 100 μm | 150 μm |
| Water Resistant Strength | excellent | excellent | excellent | excellent | excellent | excellent | good |
| Exposure Time | 2 min. | 2 min. | 2 min. | 2 min. | 2 min. | 2 min. | 3 min. |
| Abrasion Resistance | excellent | excellent | excellent | excellent | excellent | excellent | poor |
| Solvent Resistance | good | good | good | good | good | good | poor |

Examples D7 through D12

The above described liquid A-1 was used as the styrylpyridinium group-added, partially saponified vinyl acetate polymer, and the above described liquid B-1 was used as the photopolymerizable component. The only those used in Examples D1 through D12, but also commercially available ionomer dispersions (Copolene Latex L-6000, Copolene Latex L-4000 and Copolene Latex L-6004 supplied by Asahi-Dow K.K.), commercially available ionomer dispersions (Chemipearl S-100 and Chemipearl S-120 supplied by Mitsui Sekiyu Kagaku Kogyo K.K.) and commercially available ionomer dispersion (Surlyn 2 and Surlyn S2 supplied by Du Pont Co.) were used.

The foregoing components were mixed at the weight ratios shown in Table 4, and screen plates were prepared in the same manner as in Examples D1 through D12. The obtained results are shown in Table 4.

4) was prepared and used as the photopolymerizable component.

The water-dispersible polymer shown in Table 5 was mixed with the liquids A-3 and B-3 at the weight ratios shown in Table 5.

Screen plates were prepared and tested in the same

TABLE 4

|  | Example D13 | Example D14 | Example D15 | Example D16 | Example D17 | Example D18 | Comparative Example D |
|---|---|---|---|---|---|---|---|
| Liquid A-2 | 260 parts | 260 parts | 260 parts | 260 parts | 260 parts | 260 parts | — |
| Liquid B-1 | 45 parts | 45 parts | 45 parts | 45 parts | 45 parts | 45 parts | — |
| KA-8100 | — | 7 parts | — | — | — | — | — |
| KA-8066 | — | — | — | 7 parts | — | — | — |
| HW-140 | 15 parts | — | 15 parts | — | — | 15 parts | — |
| HW-100 | 15 parts | 15 parts | 15 parts | — | 15 parts | 15 parts | — |
| HW-111 | — | — | — | — | 20 parts | — | — |
| ES-675 | — | — | — | 15 parts | — | — | — |
| L-6000 | 20 parts | — | — | — | — | — | — |
| L-4000 | — | 20 parts | — | — | — | — | — |
| L-6004 | — | — | 24 parts | — | — | — | — |
| S-100 | — | — | — | 30 parts | — | — | — |
| S-120 | — | — | — | — | 30 parts | — | — |
| S2 | — | — | — | — | — | 28 parts | — |
| Resolving Power | 100 μm | 100 μm | 100 μm | 100 μm | 100 μm | 100 μm | 150 μm |
| Water Resistant Strength | excellent | excellent | excellent | excellent | excellent | excellent | good |
| Exposure Time | 2 min. | 2 min. | 2 min. | 2 min. | 2 min. | 2 min. | 3 min. |
| Abrasion Resistance | excellent | excellent | exceleent | excellent | excellent | excellent | poor |
| Solvent Resistance | good | good | good | good | good | good | poor |

Examples D19 through D22 manner as in Examples D1 through D18. The obtained results are shown in Table 5.

TABLE 5

|  | Example D19 | Example D20 | Example D21 | Example D22 | Comparative Example D |
|---|---|---|---|---|---|
| Liquid A-3 | 300 parts | 300 parts | 300 parts | 300 parts | — |
| Liquid B-2 | 35 parts | 35 parts | 35 parts | 35 parts | — |
| KA-8100 | 30 parts | — | — | — | — |
| HW-140 | — | 40 parts | 5 parts | — | — |
| HW-100 | — | 10 parts | 45 parts | — | — |
| ES-675 | — | — | — | 35 parts | — |
| Resolving Power | 100 μm | 100 μm | 100 μm | 100 μm | 150 μm |
| Water Resistant Strength | excellent | excellent | excellent | excellent | good |
| Exposure Time | 2 minutes | 2 minutes | 2 minutes | 2 minutes | 3 minutes |
| Abrasion Resistance | excellent | excellent | excellent | excellent | poor |
| Solvent Resistance | good | good | good | good | poor |

A 12% aqueous solution (hereinafter referred to as "liquid A-3") of a polymer obtained by adding 1.3 mole % of N-methyl-γ-(p-formylstyryl)pyridinium-p-toluene-sulfonate and 0.5 mole % of sodium o-benzaldehyde-sulfonate to partially saponified polyvinyl acetate having a polymerization degree of 1,700 and a saponification degree of 88 mole % (GH-17 supplied by Ninon Gosei Kagaku Kogyo K.K.) by acetalization was prepared and used as a styrylpyridinium groupadded, partially saponified vinyl acetate polymer.

A liquid mixture (hereinafter referred to as "liquid B-3") comprising 2 parts of benzyldimethyl ketal (Irgacure 651), 1 part of a thioxanthone type photo-polymerization initiator (PTX supplied by Nihon Kayaku K.K.), 0.5 part of a photo-polymerization sensitizer (DMBI supplied by Nihon Kayaku K.K.), 0.01 part of p-methoxyphenol, 40 parts of an acrylate oligomer (M-8060) and 30 parts of a polyester type acrylate (A-BPE- Examples D23 through D26

A 12% aqueous solution (hereinafter referred to as "liquid A-4") of a polymer obtained by adding 1.0 mole % of N-methyl-γ-(p-formylstyryl)quinolinium-p-toluene-sulfonate to saponified polyvinyl acetate having a polymerization degree of 1,100 (GM-11 supplied by Nihon Gosei Kagaku Kogyo K.K.) by acetalization was prepared and used as the styrylquinolinium group-added, saponified vinyl acetate polymer. The liquid B-2 was used as the photo-polymerizable component, and the water-dispersible polymer shown in Table 6 was mixed into the liquids A-4 and B-2 at the weight ratios shown in Table 6.

Screen plates were prepared and tested in the same manner as in Examples D1 through D22. The obtained results are shown in Table 6.

TABLE 6

|  | Example D23 | Example D24 | Example D25 | Example D26 | Comparative Example D |
| --- | --- | --- | --- | --- | --- |
| Liquid A-4 | 300 parts | 300 parts | 300 parts | 300 parts | — |
| Liquid B-2 | 33 parts | 33 parts | 33 parts | 33 parts | — |
| KA-8100 | 30 parts | — | — | — | — |
| HW-140 | — | 20 parts | 5 parts | — | — |
| HW-100 | — | 30 parts | 45 parts | — | — |
| ES-675 | — | — | — | 35 parts | — |
| Resolving Power | 100 μm | 100 μm | 100 μm | 100 μm | 150 μm |
| Water Resistant Strength | excellent | excellent | excellent | excellent | good |
| Exposure Time | 2 min. | 2 min. | 2 min. | 2 min. | 3 min. |
| Abrasion Resistance | excellent | excellent | excellent | excellent | poor |
| Solvent Resistance | good | good | good | good | poor |

Application Example D1

The photosensitive liquor prepared in Example D3 was applied as coating to a thickness of 15 μm on a matted polyester base film (Diamat supplied by Kimoto K.K.) and then dried. A positive film was applied to the coating base film, and the assembly was exposed to rays from a 4-KW super-high pressure mercury lamp placed 1 m apart from the assembly for 2 minutes. The entire surface was lightly wetted with city water and water spray development was conducted. Then, dyeing was carried out with a dyeing solution [Bromophenol Blue solution or Doctor Martin (tradename)]. A visible image negative to the positive film was formed on the polyester base film.

Negative visible images were obtained in the same manner as described above by using the photosensitive compositions prepared in Examples D1, D2 and D4 through D26.

Application Example D2

The photosensitive liquor obtained in Example D13 was applied as coating on a smooth surface of a polyester film having a thickness of 75 μm by an experimental bar coater and dried with warm air at 40° C.

The thickness of the photosensitive film after drying was 25 μm. A 300-mesh polyester net was secured to a screen frame, and the screen was washed and the photosensitive coating surface was gently bonded to the wet screen. Then, the screen plate having the photosensitive film and polyester film bonded thereto was placed on a flat stand, and the assembly was pressed from the screen side by a rubber roller or squeegee so that the photosensitive film was stuck firmly to the screen. Then, the assembly was dried with warm air (40° C.) for 30 minutes, and the polyester film was gently peeled. Thus, the photosensitive film was transferred on the screen. The surface on which the polyester film had been present was very smooth. The screen was kept in the dark in this state for 1 month, and then, a positive film was applied to the photosensitive film, and the assembly was exposed to rays from a 4-KW super-high pressure mercury lamp placed 1 m apart from the assembly for 2 minutes, followed by water development. A screen plate capable of resolving a line of 100 μm with a beautiful edge was obtained.

Referential Example D

In the same manner as described in Application Example D2, the photosensitive liquor was applied as coating and dried on a polyester film. The coating film was placed on a stand so that the photosensitive film surface was on top. Then, a 270-mesh polyester colored screen was placed on the coating film and temporarily secured onto the stand. A small amount of the photosensitive liquor of Example D13 was applied as coating with a bar coater so that the screen and photosensitive film were wetted with the photosensitive solution. The assembly was dried with a drier and the temporary fixation was released. Thus, a screen plate having the photosensitive film secured to the screen was obtained. Furthermore, when the photosensitive liquor was applied as coating and dried on a screen which had been subjected to resin finishing so as to control the flexibility, a screen plate comprising the integrated screen and photosensitive film was obtained.

Application Example D3

The photosensitive liquor obtained in Example D13 was applied as coating with a coater on a 130-mesh polyester screen which had been subjected to resin finishing so as to control the flexibility, whereby a photosensitive resin-finished screen having a thickness of 15 μm in addition to the screen thickness was obtained. The screen was cut into a piece of 20 cm × 30 cm size, which was stored for 6 months in a black vinyl bag at room temperature. Then, the sample was taken out from the vinyl bag and a printing plate was prepared by using a one-point mark positive film for T-shirts. The printing plate was fixed to a wood frame and T-shirts were printed with an aqueous ink by using the printing screen. Beautiful one-point marks were printed on the T-shirts.

Application Example D4

The photosensitive liquor obtained in Example D13 was applied as coating two times on a polyester film having a thickness of 75 μm by using a coating machine to form a direct-indirect method photosensitive film having a thickness of 30 μm. The direct-indirect method film was water-stuck to a 270-mesh polyester screen dyed an orange color. After drying, the same photosensitive liquor was reciprocatively applied as coating from the screen side by using a bucket, which step was followed by drying. The thus obtained PS plate was stored in a vinyl bag for 1 year. A pattern printing plate (line width of 100 μm) for printed-wiring boards was prepared, and when printing was carried out 3,000 times, the plate was not damaged at all.

Application Example D5

The photosensitive liquor obtained in Example D13 was applied as coating by means of a coating machine on a polyester film having a thickness of 75 μm to form a direct-indirect method film having a thickness of 20 μm. A 300-mesh red-dyed polyester screen was uniformly stretched on an aluminum frame of 950 mm×950 mm size. The above film was water-stretched on the degreased and washed screen and after ample drying, the base film was peeled. A positive film for a 150-line net screen was vacuum-stuck to the photosensitive film surface of the screen to form a printing plate. When papers were printed by using the thus obtained plate, clear prints that could not be obtained by using the conventional screen plates were obtained. For reference, when a conventional diazo photosensitive solution was used, the printable line number was 120 as a limit.

What is claimed is:

1. A photo-sensitive resin composition in the form of an aqueous emulsion comprising the following components (1) through (4):

(1) a water soluble saponified vinyl acetate polymer to which a styrylpyridinium or a styrylquinolinium group has been added, the polymer having been obtained by adding 0.3 to 20 mole % of a styrylpyridinium group or styrylquinolinium group to a saponified vinyl acetate polymer having a polymerization degree of 300 to 3000 and a saponification degree of 70 to 99 mole %, and having a styrylpyridinium group or styrylquinolinium group represented by the following formula inclusively of the chain of the vinyl acetate polymer:

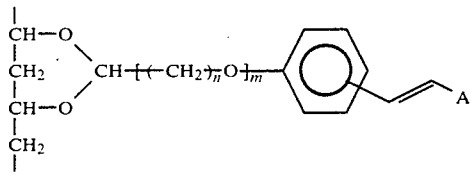

wherein: m is 0 or 1; n is an integer of from 1 to 6; and A stands for;

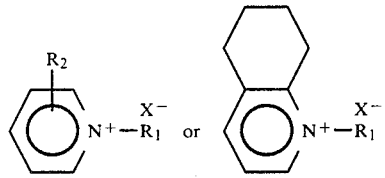

in which: $R_1$ stands for a hydrogen atom or an alkyl or aralkyl group which may contain a hydroxyl group, a carbamoyl group, an ether bond or an unsaturated bond; $R_2$ stands for a hydrogen atom or a lower alkyl group; and $X^-$ stands for a halide ion, a phosphate ion, a p-toluene-sulfonate ion, a methyl sulfate ion, an ethyl sulfate ion or a mixture of two or more of these anions; the polymer being dissolved in said composition;

(2) a polymer selected from the group consisting of water-dispersible polymers and hydrophobic polymers, the water-dispersible polymers being dispersed in said composition and the hydrophobic polymers being emulsified in said composition;

(3) a photo-polymerizable unsaturated compound having at least one ethylenically unsaturated group, the unsaturated compound being insoluble or hardly soluble in water and capable of being emulsified in an aqueous solution of the polymer of the component (1);

(4) a photo-polymerization initiator, the initiator being soluble in the unsaturated compound of the component (3);

the amounts of the components being such that the amount of the polymer of component (1) is 0.2 to 10 parts by weight per part of the polymer of component (2), the amount of the unsaturated compound of component (3) is 0.1 to 15 parts by weight per part of the polymer of component (2), and the amount of the initiator of component (4) is 0.001 to 0.15 part by weight of the unsaturated compound of component (3); the composition being capable, in the form of dried film produced therefrom and when irradiated with light of, becoming insoluble at the portion which has been irradiated with light but remaining soluble in water at the portion which has not been irradiated with light.

2. A composition as set forth in claim 1, wherein the water-dispersible polymer is a polyurethane resin or polyester resin which is rendered water-dispersible by a quaternary ammonium group, a carboxylate group, a phosphonium group, a sulfonium group, a sulfonate group, a phosphonate group or a polyethylene oxide group.

3. A composition as set forth in claim 1, wherein $R_1$ has 1 to 8 carbon atoms when it is an alkyl or aralkyl group and $R_2$ has 1 to 4 carbon atoms when it is a lower alkyl.

4. A composition as set forth in claim 1, wherein the styrylpyridinium or styrylquinolinium group-added saponified vinyl acetate polymer and the photopolymerizable unsaturated compound are contained in amounts of 0.2 to 10 parts by weight and 0.1 to 15 parts by weight, respectively, per part by weight of the water-dispersible polymer or the hydrophobic polymer.

5. A composition as set forth in claim 1, wherein the water-dispersible polymer is an ionomer resin which is a copolymer of an α-olefin and an α,β-unsaturated carboxylic acid ion-crosslinked with a metal ion selected from the group consisting of $Na^+$, $Mg^{++}$ and $Zn^{++}$.

6. A composition as set forth in claim 1 wherein component (2) is a hydrophobic polymer present in the composition in the form of an emulsion.

7. A composition as set forth in claim 1, wherein the photo-polymerization initiator (4) is soluble in component (3).

* * * * *

UNITED STATES PATENT AND TRADEMARK OFFICE
CERTIFICATE OF CORRECTION

PATENT NO. : 4,564,580
DATED : January 14, 1986
INVENTOR(S) : ICHIMURA et al.

It is certified that error appears in the above-identified patent and that said Letters Patent is hereby corrected as shown below:

Kindly amend the above-identified patent as follows:

Col. 27 (claim 1), lines 50-55, change the formula from

"
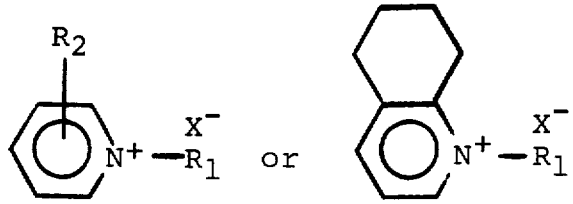
"

to

--
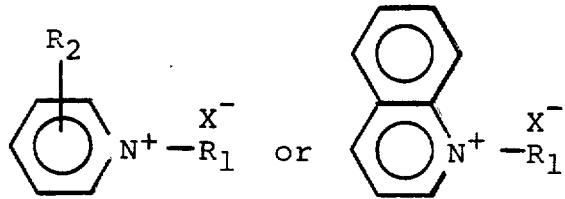
--.

Signed and Sealed this

Nineteenth Day of January, 1988

Attest:

DONALD J. QUIGG

Attesting Officer

Commissioner of Patents and Trademarks